United States Patent [19]
Sakakima et al.

[11] Patent Number: 5,243,316
[45] Date of Patent: Sep. 7, 1993

[54] MAGNETORESISTANCE EFFECT ELEMENT

[75] Inventors: Hiroshi Sakakima, Tsuzuki; Mitsuo Satomi, Katano; Toshio Takada, Kyoto; Teruya Shinjo, Uji, all of Japan

[73] Assignees: Matsushita Electric Industrial Co., Ltd., Osaka; Seisan Kaihatsu Kagaku Kenkyusho, Kyoto; TDK Corporation, Tokyo; Nippon Mining Co., Ltd., Tokyo; NEC Corporation, Tokyo; Ube Industries, Ltd., Ube; Kangafuchi Chemical Industry Co., Ltd., Osaka; Nippon Steel Corporation, Tokyo; Tosoh Corporation, Yamaguchi; Toyo Boseki Kabushiki Kaisha, Osaka, all of Japan

[21] Appl. No.: 824,005

[22] Filed: Jan. 22, 1992

[30] Foreign Application Priority Data

Feb. 4, 1991 [JP] Japan .................................. 3-013620

[51] Int. Cl.$^5$ ............................................. H01L 43/00
[52] U.S. Cl. .................................................. 338/32 R
[58] Field of Search ........................... 338/32 R, 32 H; 324/207.21

[56] References Cited

FOREIGN PATENT DOCUMENTS

| 0304280 | 2/1989 | European Pat. Off. . |
| 0406060 | 1/1991 | European Pat. Off. . |
| 2-23681 | 1/1990 | Japan . |
| 223681 | 1/1990 | Japan . |
| 472761 | 5/1969 | Switzerland . |

OTHER PUBLICATIONS

Hirsch, et al., "Origin of Interfacial Energy in Coupled Films of Permalloy and Cobalt," IEEE Transactions on Magnetics, vol. MAG-5, No. 3, Sep. 1969.

Primary Examiner—Marvin M. Lateef
Attorney, Agent, or Firm—Stevens, Davis, Miller & Mosher

[57] ABSTRACT

There is provided a magnetoresistance effect element which is a multilayer structure body wherein a first magnetic film layer made of Ni-rich Ni-Co-Fe having a thickness of 10 to 100 Å and a second magnetic film layer made of Co-rich Co-Ni-Fe having a thickness of 10 to 100 Å, which are different from each other in coercive force, are integrally laminated with a non-magnetic metal film layer having a thickness of 10 to 100 Å interposed therebetween. The non-magnetic metal film layer is of a metal, for example, Cu, Ag, Au, Pt, Ru or Re. $(Ni_A Co_{1-A})_B Fe_{1-B}$, $Ni_A Fe_{1-A}$ or $Ni_A Co_{1-A}$ is used as a material of the first magnetic film, and $(Co_C Ni_{1-C})_D Fe_{1-D}$ is used as a material of the second magnetic film.

10 Claims, 1 Drawing Sheet

MAGNETORESISTANCE EFFECT ELEMENT

BACKGROUND OF THE INVENTION

1. Industrial Field of the Invention

The present invention relates to a magneto-resistance effect element for thin film heads or magnetic field sensors.

2. Prior Art

There have conventionally been conducted developments of a magnetic resistance sensor (hereinafter referred to as an MR sensor) and a magnetic resistance head (hereinafter referred to as an MR head) in which magnetic resistance elements are employed, and Permalloy of $Ni_{0.8}Fe_{0.2}$ has been mainly used as a magnetic material applied to them. In the case of this material, however, the MR (magnetic resistance) ratio (hereinafter referred to as $\Delta R/R$) is about 2.5%, and consequently, a material having a larger $\Delta R/R$ is required to obtain a magnetic resistance element of higher sensitivity. Recently, it was discovered that a giant magnetoresistance effect is induced by an artificial superlattice film made of a thin film containing Fe and Cr (see Physical Review Letter, vol. 61, p. 2472, 1988). In the case of this material, however, a large $\Delta R/R$ can not be obtained unless an intense magnetic field of 10 kOe or more is applied to it, which results in a problem in practicability.

SUMMARY OF THE INVENTION

It is therefore a primary object of the present invention to obtain a magnetoresistance effect element which exhibits a larger magnetic resistance change in a low magnetic field for practical use.

A magnetoresistance effect element which realizes the object of the invention is a multilayer structure body in which a first magnetic film layer made of Ni-rich Ni-Co-Fe having a thickness of 10 to 100 Å and a second magnetic film layer made of Co-rich Co-Ni-Fe having a thickness of 10 to 100 Å, which are different from each other in coercive force, are integrally laminated with a non-magnetic metal film layer having a thickness of 10 to 100 Å interposed therebetween. The magnetoresistance effect element according to the invention also includes a multilayer structure body wherein the above-mentioned three layers is a basic unit, and a plurality of such units are integrally laminated with non-magnetic metal film layers having a thickness of 10 to 100 Å interposed therebetween.

As an example of metal to form the non-magnetic metal film layer, Cu, Ag, Au, Pt, Ru or Re can be suggested. With the magnetoresistance effect element, there can be produced a great magnetic resistance change at room temperature and in a weak magnetic field which has been achieved by none of the conventional magnetic resistance elements.

The material for the first magnetic film is not restricted to the above-mentioned ternary-system composition. A binary-system composition of Ni-Fe or Ni-Co may be employed.

DETAILED DESCRIPTION OF THE INVENTION

A first magnetic film layer of a magnetoresistance effect element according to the present invention is formed of a magnetic material whose primary component are of a compound denoted by the following expression 1, 2 or 3. This is a soft magnetic material having a large $\Delta R/R$, a small magneto-striction and a small coercive force.

$$(Ni_A Co_{1-A})_B Fe_{1-B} \tag{1}$$

wherein A and B designate atomic composition ratios which satisfy $0.6 \leq A \leq 1.0$, $0.7 \leq B \leq 1.0$, respectively.

$$Ni_A Fe_{1-A} \tag{2}$$

wherein A designates an atomic composition ratio which satisfies $0.7 \leq A \leq 0.9$.

$$Ni_A Co_{1-A} \tag{3}$$

wherein A designates an atomic composition ratio which satisfies $0.6 \leq A \leq 0.9$.

The material for the first magnetic film layer will not be restricted to the compounds denoted by the expression 1, 2 or 3. In order to improve the properties such as soft magnetism, wear resistance and corrosion resistance, it may include Nb, Mo, Cr, W, Ru, etc. as a secondary element, and it may further include incidental impurities.

A second magnetic film layer of the magnetoresistance effect element according to the invention is formed of a magnetic material whose primary component is of a compound denoted by the following expression 4. This is a semi-hard magnetic material having a small magneto-striction and a relatively large coercive force.

$$(Co_C Ni_{1-C})_D Fe_{1-D} \tag{4}$$

wherein C and D designate atomic composition ratios which satisfy $0.4 \leq C \leq 1.0$, $0.8 \leq D \leq 1.0$, respectively.

The material for the second magnetic film layer will not be restricted to the composition denoted by the expression 4. In order to improve the properties such as corrosion resistance, it may include Nb, Mo, Cr, W, Ru, etc. as a secondary element, and it may further include incidental impurities.

Figure 1:
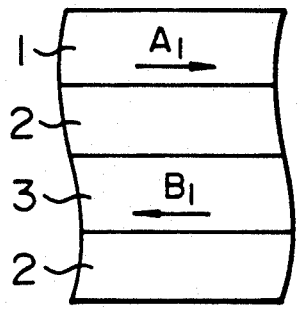
FIGS. 1 and 2 show the operational principle of a magnetoresistance effect element according to the present invention.
Figure 2:
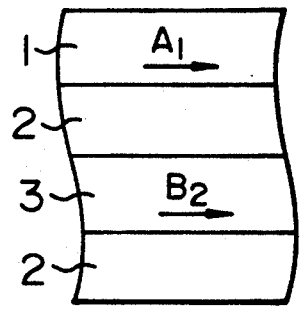
Figure 3:
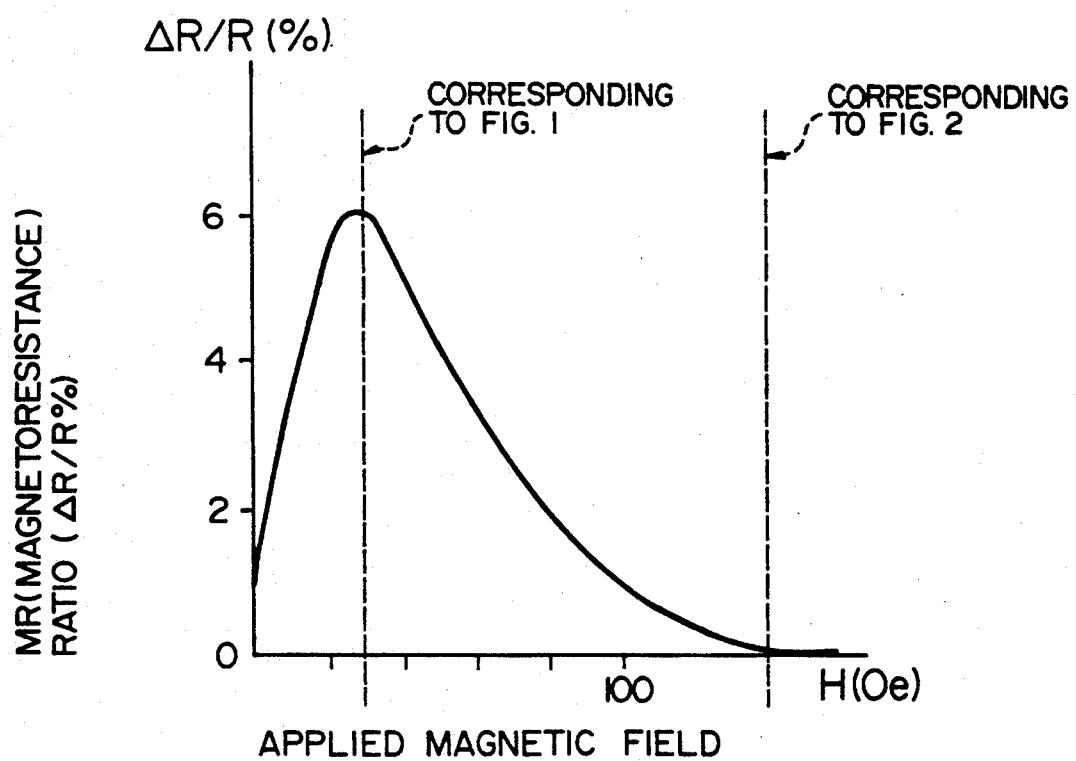
FIG. 3 is a graph illustrative of a relationship between an applied magnetic field and a MR ratio in the case of the magnetoresistance effect element of the invention in relation to FIGS. 1 and 2.

The first magnetic film layer 1 and the second magnetic film layer 3 have different coercive forces, and they are separated by a non-magnetic metal film layer 2. As shown in FIG. 1, therefore, when a weak magnetic field is applied to them, spins of the first soft magnetic film layer 1 are first rotated in that direction whereas spins of the second semi-hard magnetic film layer 3 are not reversed. Consequently, at this stage, the spin alignment of the first magnetic film layer 1 and that of the second magnetic film layer 3 are anti-parallel, and the spin scattering of conduction electrons is extremely large, thereby exhibiting a giant magnetoresistance as shown in FIG. 3. Moreover, as shown in FIG. 2, when the applied magnetic field is intensified, the spins of the second magnetic film layer 3 are also reversed, and the spin alignment of the first magnetic film layer 1 and that of the second magnetic film layer 3 become parallel. Therefore, the spin scattering of conduction electrons becomes smaller, thereby decreasing the magnetoresistance as shown in FIG. 3. In this manner, a large $\Delta R/R$ can be obtained. If the non-magnetic metal film layer 2 does not exist, however, the first magnetic film layer 1 and the second magnetic film layer 3 will be coupled magnetically. Since the condition shown in FIG. 1 will not be realized, a large magnetoresistance effect can not be obtained then. Also, preferably, the first magnetic film layer 1 and the second magnetic film layer 3 should have small magneto-strictions. This is because a large magnetostriction induces generation of noises when such a magnetoresistance effect element is used for an MR head or the like.

The Ni-rich Ni-Co-Fe alloy of the expression has a small magneto-striction and exhibits soft magnetism when its composition ratios satisfy $0.6 \leq A \leq 1.0$, $0.7 \leq B \leq 1.0$. Typical examples of it are $Ni_{0.8}Co_{0.1}Fe_{0.1}$, $Ni_{0.8}Fe_{0.2}$ and so forth. Also, Nb, Mo, Cr, W, Ru and so on may be added to the composition of the expression 1 so as to improve the soft magnetism, wear resistance and corrosion resistance to a further extent. On the other hand, the Co-rich Co-Ni-Fe alloy of the expression 4 has a relatively small magneto-striction and exhibits semi-hard magnetism when its composition ratios satisfy $0.4 \leq C \leq 1.0$, $0.8 \leq D \leq 1.0$. When selecting the composition in this manner, two kinds of magnetic films having different coercive forces can be obtained. These magnetic film layers involve drawbacks such as a decrease in magnetization at room temperature owing to a drop of Curie temperature if they are less than 10 Å thick. Further, it is at least necessary to make each magnetic film layer not more than 100 Å thick to thereby utilize the lamination effect as in the present invention because the overall thickness of a magnetoresistance effect element for practical use is several hundred angstrom (Å). Therefore, preferably, the thickness of these magnetic film layers should be 10 to 100 Å.

The non-magnetic metal film interposed between these first and second magnetic films must be made of a material which causes little reaction at interfaces with the Ni-Co-Fe magnetic films and which is non-magnetic. Cu, Ag, Au, Pt or the like is suitable. Also, Ru, Re or the like is suitable when much attention is paid to the wear resistance. The optimum thickness of this non-magnetic metal film layer is about 50 Å. If it is less than 10 Å, the two kinds of the magnetic film layers will be coupled magnetically, and it will be difficult to realize the condition in which the magnetic film layers 1 and 3 of different coercive forces have anti-parallel spin configuration, as shown in FIG. 1. Also, if it exceeds 100 Å, the resistance of the non-magnetic metal film layer which does not exhibit no such magnetoresistance effect causes the magnetic resistance change of the whole magnetoresistance effect element to decrease. Therefore, preferably, the thickness of the non-magnetic metal film layer should be 10 to 100 Å. Hereinafter, the effects of the present invention will be explained on the basis of a concrete example.

Example

Magnetoresistance effect elements of the following structures (Sample Nos. 1 to 3) were formed on glass substrates by means of an ultra-high vacuum deposition apparatus.

1: [Ni-Fe(30)/Cu(50)/Co-Ni(30)/Cu(50)]
2: [Ni-Fe(30)/Au(50)/Co-Ni(30)/Au(50)]
3: [Ni-Fe(30)/Ag(50)/Co-Ni-Fe(30)/Ag(50)]

(Each slash "/" indicates that a film described before the slash and a film described after the slash are placed one above the other. The number in each pair of parentheses ( ) indicates the thickness (Å) of each film.)

$Ni_{0.8}Fe_{0.2}$, $Co_{0.65}Ni_{0.35}$ and $Co_{0.8}Ni_{0.1}Fe_{0.1}$ were used as evaporation sources of Ni-Fe, Co-Ni, and Co-Ni-Fe, respectively, and films were deposited by using of an electron beam gun. Further, the thickness of each film was controlled by a quartz oscillator monitor and a shutter.

Similarly, $Ni_{0.8}Co_{0.2}$, $Ni_{0.7}Co_{0.2}Fe_{0.1}$ and $Co_{0.65}Ni_{0.35}$ were used as evaporation sources, and the following samples Nos. 4 to 6 were formed.

4: [Ni-Co(30)/Pt(50)/Co-Ni(30)/Pt(50)]
5: [Ni-Co-Fe(30)/Cu(50)/Co-Ni(30)/Cu(50)]
6: [Ni-Co-Fe(30)/Ru(50)/Co-Ni(30)/Ru(50)]

Properties of the magnetoresistance effect elements thus obtained are shown in Table 1.

TABLE 1

| No. | RATE OF MAGNETIC RESISTANCE CHANGE $\Delta R/R$ (%) | COERCIVE FORCE Hc (Oe) |
| --- | --- | --- |
| 1 | 9 | 40 |
| 2 | 4 | 30 |
| 3 | 5 | 25 |
| 4 | 8 | 35 |
| 5 | 7 | 40 |
| 6 | 4 | 40 |

The deposition of each film was conducted in a magnetic field, and its magnetoresistance effect was measured when applying the magnetic field in a direction of the axis of hard magnetization of the film. A coercive force of each film shown in Table 1 is a value in a direction of the axis of easy magnetization of the film. As shown above, the magnetoresistance effect elements according to the invention have practical properties such as a large $\Delta R/R$ at room temperature and a relatively small Hc.

As has been described above, the present invention enables a magnetoresistance effect element which exhibits a great magnetoresistance effect at room temperature and in an applied magnetic field for practical use. This magnetoresistance effect element, whose magnetostriction is small, is suitable when applied to a highly sensitive MR head or the like.

What is claimed is:

1. A magnetoresistance effect element comprising a first magnetic film layer having a thickness of 10 to 100 Å, a second magnetic film layer having a thickness of 10 to 100 Å whose coercive force is different from that of said first film layer, and a non-magnetic metal film layer having a thickness of 10 to 100 Å interposed between said first and second film layers, said first and second magnetic film layers and said non-magnetic metal film layer being integrally laminated.

2. A magnetoresistance effect element according to claim 1, wherein said three film layers is a basic unit, and a plurality of such units are integrally laminated with non-magnetic metal film layers having a thickness of 10 to 100 Å interposed therebetween.

3. A magnetoresistance effect element comprising:
a first magnetic film layer being formed of a material whose primary component is of a compound which satisfies the expression $(Ni_A Co_{1-A})_B Fe_{1-B}$ (A and B designate atomic composition ratios which satisfy $0.6 \leq A \leq 1.0$, $0.7 \leq B \leq 1.0$, respectively), and having a thickness of 10 to 100 Å;

a second magnetic film layer being formed of a material whose primary component is of a compound which satisfies the expression $(Co_C Ni_{1-C})_D Fe_{1-D}$ (C and D designate atomic composition ratios which satisfy $0.4 \leq C \leq 1.0$, $0.8 \leq D \leq 1.0$, respectively), and having a thickness of 10 to 100 Å whose coercive force is different from that of said first film layer; and a non-magnetic metal film layer having a thickness of 10 to 100 Å interposed between said first and second magnetic film layers;

said first and second magnetic film layers and said non-magnetic metal film layer being integrally laminated.

4. A magnetoresistance effect element according to claim 3, wherein said non-magnetic metal film layer is formed of Cu, Ag, Au, Pt, Ru or Re.

5. A magnetoresistance effect element comprising:

a first magnetic film layer being formed of a material whose primary component is of a compound which satisfies the expression $(Ni_A Fe_{1-A})$ (A designates an atomic composition ratio which satisfies $0.7 \leq A \leq 0.9$), and having a thickness of 10 to 100 Å;

a second magnetic film layer being formed of a material whose primary component is of a compound which satisfies the expression $(Co_C Ni_{1-C})_D Fe_{1-D}$ (C and D designate atomic composition ratios which satisfy $0.4 \leq C \leq 1.0$, $0.8 \leq D \leq 1.0$, respectively), and having a thickness of 10 to 100 Å whose coercive force is different from that of said first film layer; and a non-magnetic metal film layer having a thickness of 10 to 100 Å interposed between said first and second magnetic film layers;

said first and second magnetic film layers and said non-magnetic metal film layer being integrally laminated.

6. A magnetoresistance effect element according to claim 5, wherein said non-magnetic metal film layer is formed of Cu, Ag, Au, Pt, Ru or Re.

7. A magnetoresistance effect element comprising:

a first magnetic film layer being formed of a material whose primary component is of a compound which satisfies the expression $(Ni_A Co_{1-A})$ (A designates and atomic composition ratio which satisfies $0.6 \leq A \leq 0.9$), and having a thickness of 10 to 100 Å;

a second magnetic film layer being formed of a material whose primary component is of a compound which satisfies the expression $(Co_C Ni_{1-C})_D Fe_{1-D}$ (C and D designate atomic composition ratios which satisfy $0.4 \leq C \leq 1.0$, $0.8 \leq D \leq 1.0$, respectively), and having a thickness of 10 to 100 Å whose coercive force is different from that of said first film layer; and a non-magnetic metal film layer having a thickness of 10 to 100 Å interposed between said first and second magnetic film layers;

said first and second magnetic film layers and said non-magnetic metal film layer being integrally laminated.

8. A magnetoresistance effect element according to claim 7, wherein said non-magnetic metal film layer is formed of Cu, Ag, Au, Pt, Ru or Re.

9. A magnetoresistance effect element comprising:

a first magnetic film layer having a thickness of 10 to 100 Å;

a second magnetic film layer having a thickness of 10 to 100 Å whose coercive force is different from that of said first film layer; and a non-magnetic metal film layer being formed of Cu, Ag, Au, Pt, Ru or Re and having a thickness of 10 to 100 Å interposed between said first and second magnetic film layers, said first and second magnetic film layers and said non-magnetic metal film layer being integrally laminated.

10. A magnetoresistance effect element according to claim 9, wherein said three film layers is a basic unit, and a plurality of such units are integrally laminated with non-magnetic metal film layers having a thickness of 10 to 100 Å interposed therebetween.

* * * * *

UNITED STATES PATENT AND TRADEMARK OFFICE
CERTIFICATE OF CORRECTION

PATENT NO. : 5,243,316

DATED : September 7, 1993

INVENTOR(S) : Hiroshi SAKAKIMA, Mitsuo SATOMI, Toshio TAKADA and Teruya SHINJO

It is certified that error appears in the above-identified patent and that said Letters Patent is hereby corrected as shown below:

Title page: Item (73), change "Kangafuchi" to --Kanegafuchi--.

Signed and Sealed this

Nineteenth Day of July, 1994

Attest:

BRUCE LEHMAN

*Attesting Officer*  *Commissioner of Patents and Trademarks*